United States Patent
Ha

(10) Patent No.: US 10,338,464 B2
(45) Date of Patent: Jul. 2, 2019

(54) PHOTOMASK INCLUDING TRANSFER PATTERNS FOR REDUCING A THERMAL STRESS

(71) Applicant: SK hynix Inc., Icheon (KR)

(72) Inventor: Tae Joong Ha, Daejeon (KR)

(73) Assignee: SK HYNIX INC., Icheon (KR)

( * ) Notice: Subject to any disclaimer, the term of this patent is extended or adjusted under 35 U.S.C. 154(b) by 73 days.

(21) Appl. No.: 15/812,098

(22) Filed: Nov. 14, 2017

(65) Prior Publication Data

US 2018/0074396 A1 Mar. 15, 2018

Related U.S. Application Data

(63) Continuation of application No. 14/932,673, filed on Nov. 4, 2015, now Pat. No. 9,846,358.

(30) Foreign Application Priority Data

| Apr. 2, 2015 | (KR) | 10-2015-0046923 |
| Jul. 20, 2015 | (KR) | 10-2015-0102177 |

(51) Int. Cl.
  *G03F 1/26* (2012.01)
  *G03F 1/28* (2012.01)
  *G03F 1/38* (2012.01)

(52) U.S. Cl.
  CPC .............. *G03F 1/38* (2013.01); *G03F 1/26* (2013.01); *G03F 1/28* (2013.01)

(58) Field of Classification Search
  CPC ................ G03F 1/26; G03F 1/28; G03F 1/38

USPC ............................................................. 430/5
See application file for complete search history.

(56) References Cited

U.S. PATENT DOCUMENTS

| 7,029,803 B2 * | 4/2006 | Becker .................. C23C 14/10 |
| | | 430/5 |
| 2011/0086296 A1 * | 4/2011 | Moon ...................... G03F 1/32 |
| | | 430/5 |

FOREIGN PATENT DOCUMENTS

| KR | 10-2009-0031558 A | 3/2009 |
| KR | 10-2010-0081831 A | 7/2010 |

* cited by examiner

*Primary Examiner* — Christopher G Young

(57) ABSTRACT

A photomask includes a light transmission substrate, a plurality of pattern regions disposed over the light transmission substrate, a shape of the plurality of pattern regions being transferred onto a wafer during an exposure process, and a light blocking region surrounding the plurality of pattern regions. Each of the plurality of pattern regions is a light transmitting region that exposes a portion of the light transmission substrate. The light blocking region includes first light blocking patterns that respectively surround the plurality of pattern regions to have closed loop shapes and second light blocking patterns that are disposed between adjacent first light blocking patterns, adjacent second light blocking patterns being spaced apart from each other by a first distance in a first direction. And the first light blocking patterns have a first thickness and the second light blocking patterns have a second thickness which is smaller than the first thickness.

15 Claims, 16 Drawing Sheets

PHOTOMASK INCLUDING TRANSFER PATTERNS FOR REDUCING A THERMAL STRESS

CROSS-REFERENCE TO RELATED APPLICATIONS

This application is a continuation application of U.S. patent application Ser. No. 14/932,673 filed on Nov. 4, 2015, which claims priority under 35 U.S.C 119(a) to Korean Patent Application Nos. 10-2015-0046923 and 10-2015-0102177, filed on Apr. 2, 2015 and Jul. 20, 2015, respectively, which are herein incorporated by references in their entirety.

BACKGROUND

1. Technical Field

Various embodiments of the present disclosure relate to photomasks including transfer patterns for reducing a thermal stress.

2. Related Art

In general, a semiconductor device may include a plurality of patterns disposed on a semiconductor substrate. The patterns may be formed by performing a photolithography process and an etch process to fabricate active elements and/or passive elements on the semiconductor substrate. Such a photolithography process may be performed to form photoresist patterns. More specifically, the photolithography process may be performed by coating a photoresist material on a target layer to form a photoresist layer, selectively exposing portions of the photoresist layer to light with a photomask, and developing the exposed photoresist layer to form the photoresist patterns. The photoresist patterns may be used as etch masks for patterning the target layer. As such, the photomask may be used to transfer predetermined pattern images onto the photoresist layer and may include a transparent substrate and a plurality of transfer patterns.

In a photolithography process, light having a specific wavelength may be irradiated onto a photoresist layer over a wafer through a photomask. In such a case, the photomask includes light transmitting regions and light blocking regions. The light blocking regions on which light blocking patterns are disposed may block a first portion of incident light to prevent the first portion of the incident light from reaching the wafer, and the light transmitting regions may transmit a second portion of the incident light to allow the second portion of the incident light to reach the wafer. During the photolithography process, the light blocking patterns may absorb a large amount of energy of the light irradiated onto the photomask, thereby generating heat. The heat may be conducted to the transparent substrate of the photomask, and thus the transparent substrate may expand to cause a thermal deformation due to the heat. The thermal deformation of the transparent substrate may cause a distortion of overlay patterns of the photomask. As a result, the thermal deformation of the transparent substrate may lead to an overlay error between the photomask and the wafer. Moreover, the second portion of the incident light penetrating the light transmitting regions of the photomask may reach the wafer through a lens module. Accordingly, if an amount (e.g., an intensity) of light penetrating the lens module increases, the lens module may expand excessively to cause a fabrication error in the photolithography process.

SUMMARY

According to one embodiment, a photomask includes a light transmission substrate, a plurality of pattern regions disposed over the light transmission substrate, a shape of the plurality of pattern regions being transferred onto a wafer during an exposure process, and a light blocking region surrounding the plurality of pattern regions. Each of the plurality of pattern regions is a light transmitting region that exposes a portion of the light transmission substrate. The light blocking region includes first light blocking patterns that respectively surround the plurality of pattern regions to have closed loop shapes and second light blocking patterns that are disposed between adjacent first light blocking patterns, adjacent second light blocking patterns being spaced apart from each other by a first distance in a first direction. And the first light blocking patterns have a first thickness and the second light blocking patterns have a second thickness which is smaller than the first thickness.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

It will be understood that although the terms first, second, third etc. may be used herein to describe various elements, these elements should not be limited by these terms. These terms are only used to distinguish one element from another element. Thus, a first element in some various embodiments could be termed a second element in other embodiments without departing from the teachings of the present disclosure. Moreover, various embodiments are directed to photomasks for depressing a thermal stress by heat.

It will also be understood that when an element is referred to as being located "on,", "over,", "above,", "under,", "beneath" or "below" another element, it may directly contact the other element, or at least one intervening element may be present therebetween. Accordingly, the terms such as "on,", "over,", "above,", "under,", "beneath,", "below" and the like that are used herein are for the purpose of describing particular embodiments only and are not intended to limit the scope of the present disclosure.

Figure 1:
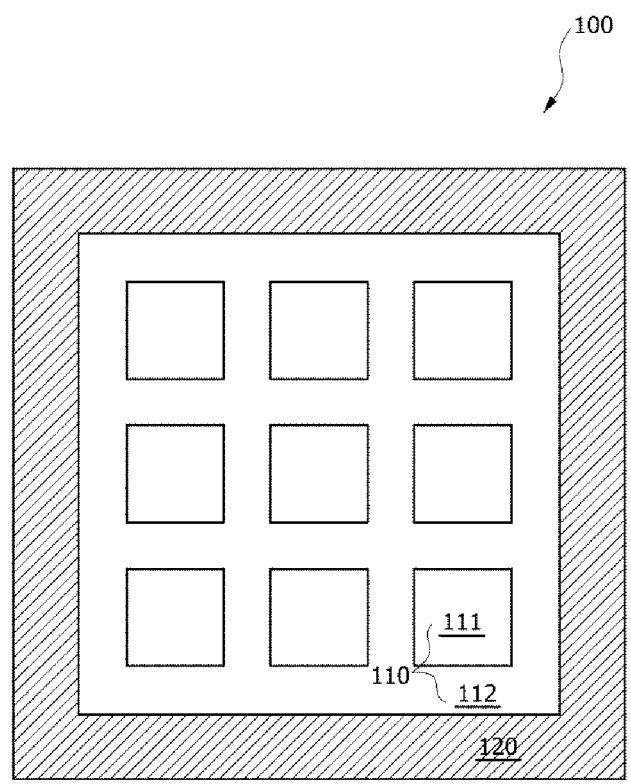
FIG. 1 is a plan view illustrating a photomask according to a first embodiment.

FIG. 1 is a plan view illustrating a photomask 100 according to a first embodiment. Referring to FIG. 1, the photomask 100 may include a transfer region 110 and a frame region 120 surrounding the transfer region 110. The transfer region 110 may be defined as a region including patterns whose shapes are transferred onto a wafer by an exposure process. The frame region 120 may be a region corresponding to a border region between adjacent shot areas (or adjacent chip areas), in order to prevent process errors due to an unnecessary exposure of the border region.

The transfer region 110 may include a plurality of pattern regions 111 and a light transmitting region 112 surrounding the pattern regions 111. A transfer pattern may be disposed in each of the pattern regions 111. The plurality of pattern regions 111 may be arranged in a matrix form to be spaced apart from each other by a predetermined distance. In the embodiment shown in FIG. 1, the plurality of pattern regions 111 may have the same size, and a distance between adjacent pattern regions 111 in a first direction (e.g., a horizontal direction with respect to the orientation of FIG. 1) may be equal to a distance between the adjacent pattern regions 111 in a second direction (e.g., a vertical direction with respect to the orientation of FIG. 1). In other embodiments, the plurality of pattern regions 111 may have different sizes, and distances between adjacent pattern regions 111 in the first and second directions may also be different from each other.

In the embodiment shown in FIG. 1, each of the pattern regions 111 may include a transfer pattern for forming a hole-shaped pattern such as a contact hole on a wafer. Each of the pattern regions 111 may have a tetragonal shape, but embodiments of the present disclosure are not limited thereto. In some embodiments, each of the pattern regions 111 may have a circular shape when viewed in a plan view. A dark field pattern may be disposed in each of the pattern regions 111 to act as a transfer pattern.

If the photomask 100 is a binary photomask, the dark field pattern may be a light blocking pattern that includes chrome (Cr). If the photomask 100 is a phase shift photomask, the dark field pattern may be a phase shift pattern that includes molybdenum silicon (MoSi). A first portion of a light transmission substrate of the photomask 100 corresponding to the light transmitting region 112 may not be covered with a light blocking layer. A second portion of the light transmission substrate corresponding to the frame region 120 may be covered with the light blocking layer such as a Cr layer. If the dark field patterns are disposed in the pattern regions 111 of the photomask 100, the photomask 100 may be used in a photolithography process for transferring shapes of the dark field patterns onto a negative photoresist layer formed on the wafer.

In order to transfer a shape of a transfer pattern disposed in each of the pattern regions 111 on the wafer, the photomask 100 may be first loaded into an exposure apparatus. In an embodiment, the photomask 100 may be accurately located at a predetermined position in the exposure apparatus using overlay patterns, for example, pre-alignment keys of the photomask 100.

The photomask 100 may be disposed between a light source and the wafer. The light source may emit light onto the photomask 100. Most of light incident on the pattern regions 111 may be blocked by the transfer patterns disposed in the pattern regions 111. For example, more than 90%, 95%, or 99% of the amount of light incident on the pattern regions 111 may be blocked by the transfer patterns disposed in the pattern regions 111.

In contrast, most of light incident on the light transmitting region 112 may be transmitted through the photomask 100 to reach a negative photoresist layer coated on the wafer. For example, more than 90%, 95%, or 99% of the amount of light incident on the light transmitting region 112 may be transmitted through the photomask 100. Portions of the negative photoresist layer exposed to the portion of the light transmitted through the photomask 100 may be chemically cross-linked and polymerized to have a chemical structure that is not dissolved by a developer.

On the contrary, other portions of the negative photoresist layer corresponding to the pattern regions 111 may not be directly exposed to the light. Thus, the other portions of the negative photoresist layer corresponding to the pattern regions 111 may maintain the original chemical structure of the negative photoresist layer that is readily dissolved by the developer.

Accordingly, if the negative photoresist layer is developed using the developer after the exposure process, the other portions of the negative photoresist layer corresponding to the pattern regions 111 may be selectively removed to thereby form a photoresist pattern exposing portions of an etch target layer disposed under the negative photoresist layer.

Subsequently, an etch process may be performed on the etch target layer using the photoresist pattern as an etch mask, thereby forming holes in the etch target layer. The holes formed in the etch target layer may correspond to the pattern regions 111 of the photomask 100, and thus the shapes of the transfer patterns in the pattern regions 111 may be transferred on the wafer disposed below the etch target layer.

Figure 2:
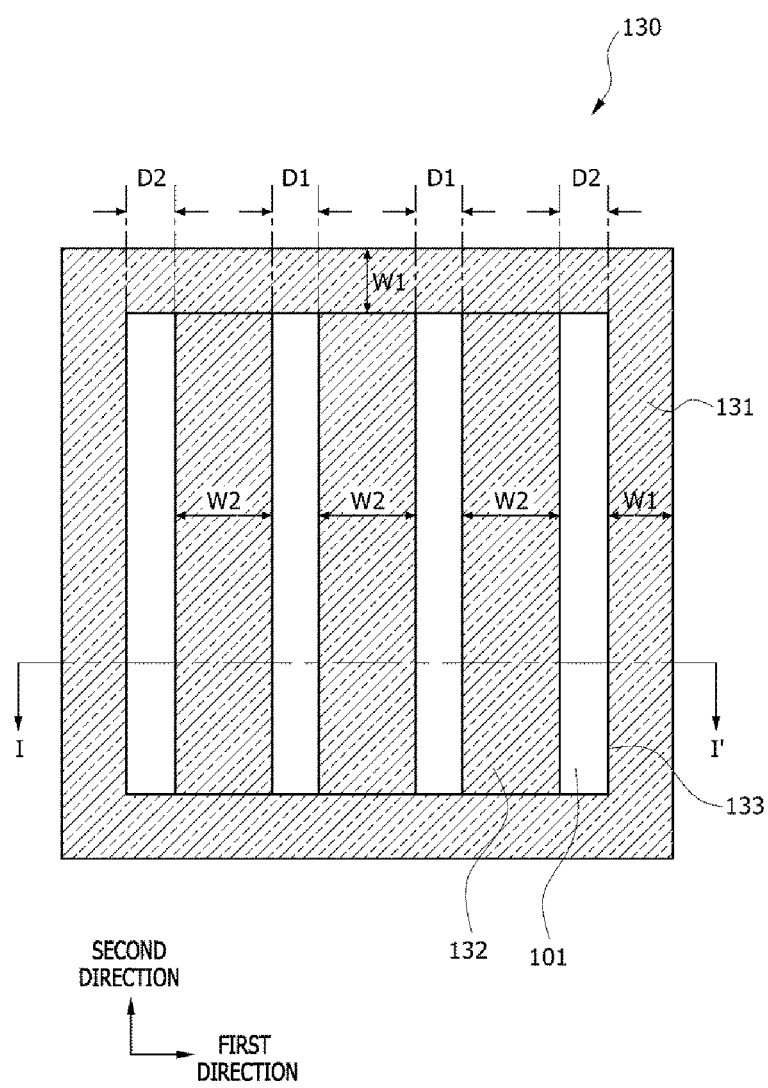
FIG. 2 is a plan view illustrating a transfer pattern of the photomask shown in FIG. 1 according to an embodiment.
Figure 3:
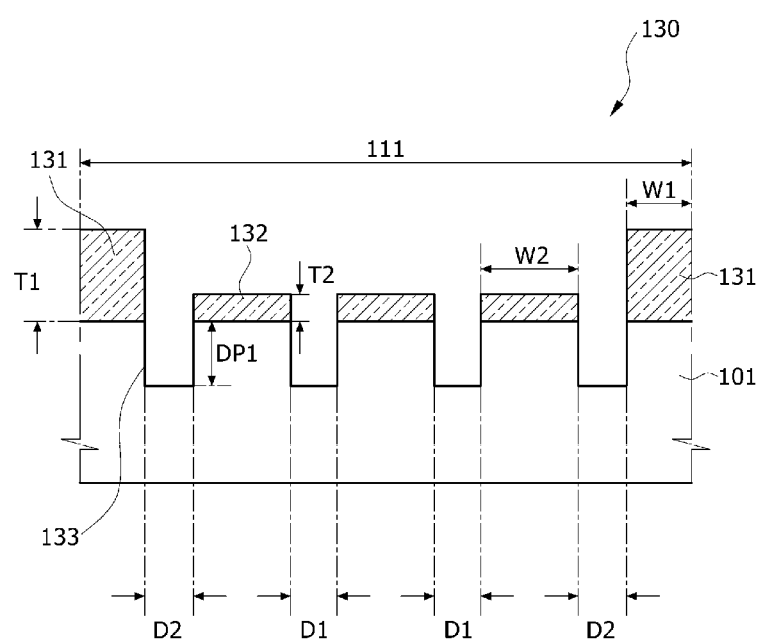
FIG. 3 is a cross-sectional view taken along a line I-I' of FIG. 2.

FIG. 2 is a plan view illustrating a transfer pattern 130 disposed in one of the pattern regions 111 of the photomask 100 shown in FIG. 1 according to an embodiment, and FIG. 3 is a cross-sectional view taken along a line I-I' of FIG. 2. Referring to FIGS. 2 and 3, the transfer pattern 130 may be disposed on a portion of a light transmission substrate 101 corresponding to any one of the pattern regions 111 of the photomask 100 of FIG. 1, as described above with reference to FIG. 1.

The transfer pattern 130 may include a first transfer pattern 131 and a plurality of second transfer patterns 132. The first transfer pattern 131 may have a rectangular closed loop shape when viewed in a plan view and may have a uniform width W1. For example, the uniform with W1 corresponds to a length of the first transfer pattern 131 in a direction perpendicular to the longitudinal direction of the first transfer pattern 131.

The second transfer patterns 132 may be disposed in an opening surrounded by the first transfer pattern 131, and may be arrayed in a first direction (e.g., a horizontal direction with respect to the orientation of FIG. 2) such that adjacent second transfer patterns 132 are spaced apart from each other by a first distance D1. Each of the second transfer patterns 132 may have a width W2 in the first direction. In an embodiment, the width W2 of the second transfer patterns 132 may be substantially equal to the width W1 of the first transfer pattern 131. For example, a difference between the width W2 of the second transfer patterns 132 and the width W1 of the first transfer pattern 131 is less than 5%, 3%, or 1% of an average width of the first and second transfer patterns 131 and 132.

Each of two outermost transfer patterns among the second transfer patterns 132 may be spaced apart from a corresponding one of two bar-shaped portions of the first transfer pattern 131 extending in a second direction (e.g., a vertical direction with respect to the orientation of FIG. 2) by a second distance D2. The second transfer patterns 132 may have a stripe shape when viewed in a plan view. Both ends of each second transfer pattern 132 may contact two bar-shaped portions of the first transfer pattern 131 extending in the first direction, respectively.

In an embodiment, the first distance D1 between adjacent second transfer patterns 132 may be substantially equal to the second distance D2. In some embodiments, a difference between the first distance D1 and the second distance is less than 5%, 3%, or 1% of an average length of the first and second distances D1 and D2.

The first transfer pattern 131 may be disposed on a first portion of the light transmission substrate 101 and have a first thickness T1. Each of the second transfer patterns 132 may be disposed on a corresponding one of second portions of the light transmission substrate 101 and have a second thickness T2. The second thickness T2 may be less than the first thickness T1. In some embodiments, the second thickness T2 may be within a range of about 5% to about 80% of the first thickness T1. In other embodiments, the second thickness T2 is in a range of 4.9% to 80.1%, 4.95% to 80.05%, or 4.99% to 80.01% of the first thickness T1.

If the second thickness T2 decreases, an intensity or an amount of light transmitted through the second transfer patterns 132 may increase while that of light absorbed into the second transfer patterns 132 may decrease.

In some embodiments, if the second thickness T2 is about 5% of the first thickness T1, the intensity of light transmitted through the second transfer patterns 132 may be about 40% of a total intensity of light incident on the second transfer patterns 132. If the second thickness T2 is about 80% of the first thickness T1, the intensity of light transmitted through the second transfer patterns 132 may be about 10% of the total intensity of light incident on the second transfer patterns 132.

If the intensity of light transmitted through the second transfer patterns 132 is greater than a predetermined upper limit value, a portion of the light transmitted through the second transfer patterns 132 that reaches a wafer may be too excessive, thereby causing an error in pattern transfer. Meanwhile, if the intensity of light transmitted through the second transfer patterns 132 is less than a predetermined lower limit value, an amount of energy absorbed into the second transfer patterns 132 increases, and thus a thermal stress applied to the photomask 100 may also increase.

Accordingly, in some embodiments, the second transfer patterns 132 are implemented to have the second thickness T2 that is within a range of about 5% to about 50% of the first thickness T1. In other embodiments, the second thickness T2 is in a range of 4.9% to 50.1%, 4.95% to 50.05%, or 4.99% to 50.01% of the first thickness T1. In these embodiments, the intensity of light transmitted through the second transfer patterns 132 may be within a range of about 20% to about 40% of the total intensity of light incident on the second transfer patterns 132.

Trenches 133 having a depth DP1 may be disposed in the light transmission substrate 101. Specifically, each of the trenches 133 is disposed in a gap region between adjacent second transfer patterns 132 or between an outermost second transfer pattern 132 and a bar-shaped portion of the first transfer pattern 131 extending in the second direction. Internal portions of the light transmission substrate 101 may be exposed by the trenches 133. A phase of light penetrating the trenches 133 may vary with the depth DP1 of the trenches 133. In some embodiments, the depth DP1 of the trenches 133 may be determined such that a phase difference between first light penetrating the trenches 133 and a first corresponding portion of the substrate 101 and second light penetrating the second transfer patterns 132 and a second corresponding portion of the substrate 101 is substantially equal to 180 degrees.

In some embodiments, the light transmission substrate 101 may be a quartz substrate. In some embodiments, the first and second transfer patterns 131 and 132 may be light blocking patterns that include Cr. Alternatively, the first and second transfer patterns 131 and 132 may be phase shift patterns that include MoSi.

Figure 4:
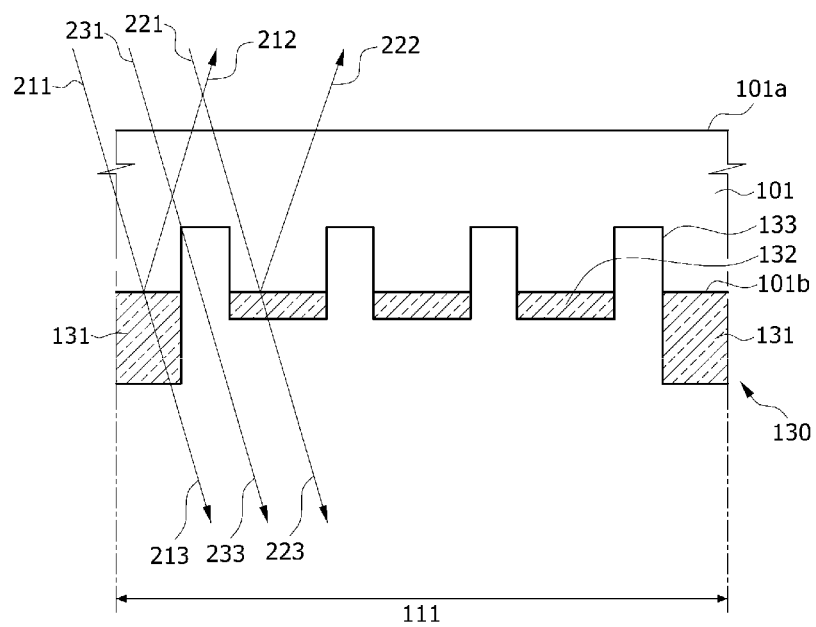
FIG. 4 is a cross-sectional view illustrating a mechanism that reduces an amount of light absorbed into the transfer pattern shown in FIGS. 2 and 3.

FIG. 4 is a cross-sectional view illustrating a mechanism that reduces an amount of light absorbed into the transfer pattern 130 shown in FIGS. 2 and 3. In FIG. 4, the same reference numerals as used in FIGS. 2 and 3 denote the same elements.

The photomask 100 of FIG. 1 may be loaded into an exposure apparatus (not shown). In the embodiment shown in FIG. 4, the photomask 100 may be located in the exposure apparatus such that a bottom surface 101a of the light transmission substrate 101 opposite to a top surface 101b on which the transfer pattern 130 is disposed faces a light source of the exposure apparatus and the transfer pattern 130 disposed on the top surface 101b of the light transmission substrate 101 faces a wafer loaded into the exposure apparatus.

Light emitted from the light source may be uniformly irradiated onto the bottom surface 101a of the light transmission substrate 101 of the photomask 100, and a portion of the light irradiated onto the bottom surface 101a of the light transmission substrate 101 may penetrate the light transmission substrate 101. If the exposure apparatus employs an off-axis illumination system, the light emitted from the light source may be obliquely irradiated onto the photomask 100 through an aperture. Although not shown in FIG. 4, the light obliquely irradiated onto the light transmitting region 112 of FIG. 1 may penetrate the light transmission substrate 101 to reach the wafer. Meanwhile, as illustrated in FIG. 4, the light irradiated toward the transfer pattern 130 may be categorized into three kinds of light, for example, first incident light 211, second incident light 221 and third incident light 231. The first incident light 211 may be obliquely irradiated toward the first transfer pattern 131, the second incident light 221 may be obliquely irradiated toward the second transfer patterns 132, and the third incident light 231 may be obliquely irradiated toward the trenches 133.

The light incident on the pattern region 111 is desirable not to change an original chemical structure of a photoresist layer, for example, a negative photoresist layer coated on the wafer. A portion of the first incident light 211 obliquely irradiated toward the first transfer pattern 131 may be transmitted through a corresponding portion of the light transmission substrate 101. For example, an amount or intensity of the transmitted portion of the first incident light 211 may be substantially equal to that of the first incident light 211 incident on a bottom surface 101a of the substrate 101. A first portion of the first incident light 211 may be reflected at an interface between the light transmission substrate 101 and the first transfer pattern 131 to produce first reflected light 212, a second portion of the first incident light 211 may be transmitted through the first transfer pattern 131 to produce first transmission light 213, and a third portion of the first incident light 211 may be absorbed into the first transfer pattern 131.

An amount of the first reflected light 212 may be determined according to a material of the first transfer pattern 131, and may be about 5% to about 50% of an amount of the first incident light 211. In an embodiment, the amount of the first reflected light 212 may be about 10% of the amount of the first incident light 211. An amount of the transmission light 213 may be determined according to the material and a thickness of the first transfer pattern 131. In some embodiments, an amount of the first transmission light 213 may be about 6% of the amount of the first incident light 211. An amount of the light absorbed into the first transfer pattern 131 may be determined by subtracting the amount of the reflected light 212 and the amount of the transmission light 213 from the amount of the first incident light 211 transmitted through the light transmission substrate 101. In some embodiments, the amount of the light absorbed into the first transfer pattern 131 may be about 84% of the amount of the first incident light 211.

A portion of the second incident light 221 obliquely irradiated toward each second transfer pattern 132 may be transmitted through a corresponding portion of the light transmission substrate 101. For example, the amount of the transmitted portion of the second incident light 221 is substantially equal to that of the second incident light 221 incident on the bottom surface 101a of the substrate 101. A first portion of the second incident light 221 may be reflected at an interface between the light transmission substrate 101 and the second transfer pattern 132 to produce second reflected light 222, a second portion of the second incident light 221 may be transmitted through the second transfer pattern 132 to produce second transmission light 223, and a third portion of the second incident light 221 may be absorbed into the second transfer pattern 132.

An amount of the second reflected light 222 may be determined according to a material of the second transfer patterns 132. In some embodiments, if the second transfer patterns 132 are comprised of the same material as the first transfer pattern 131, an amount of the second reflected light 222 may be about 10% of an amount of the second incident light 221 like the first reflected light 212. An amount of the second transmission light 223 may be determined according to the material and a thickness of the second transfer patterns 132. In some embodiments, if the second transfer patterns 132 are comprised of the same material as the first transfer pattern 131 and the thickness of the second transfer patterns 132 is within a range of about 5% to about 80% of a thickness of the first transfer pattern 131, an amount of the second transmission light 223 may be within a range of about 10% to about 40% of the amount of the second incident light 221. An amount of the light absorbed into the second transfer pattern 132 may be determined by subtracting the amount of the second reflected light 222 and the amount of the second transmission light 223 from the amount of the second incident light 221 transmitted through the light transmission substrate 101, and thus the amount of the light absorbed into the second transfer pattern 132 may be within a range of about 50% to about 80% of the amount of the second incident light 221.

Alternatively, if the second transfer patterns 132 are comprised of the same material as the first transfer pattern 131 and the thickness of the second transfer patterns 132 is within a range of about 5% to about 50% of the thickness of the first transfer pattern 131, the amount of the second transmission light 223 may be within a range of about 20% to about 40% of the amount of the second incident light 221. In such a case, the amount of the light absorbed into the second transfer pattern 132 may be within a range of about 50% to about 70% of the amount of the second incident light 221. Thus, the amount of the light absorbed into the second transfer pattern 132 may be less than that of the light absorbed into the first transfer pattern 131 because of a difference between the thickness of the first transfer pattern 131 and the thickness of the second transfer pattern 132. In addition, the amount of the light absorbed into the second transfer pattern 132 per a planar area of the second transfer pattern 132, as seen from the plan view of FIG. 2, may be less than that of the light absorbed into the first transfer pattern 131 per a planar area of the first transfer pattern 131.

The third incident light 231 obliquely irradiated toward each trench 133 may penetrate the light transmission substrate 101 to produce third transmission light 233. The second transfer pattern 132 adjacent to the trench 133 is sufficiently thin that the third incident light 231 is neither reflected by nor absorbed into the adjacent second transfer pattern 132. The third transmission light 233 penetrating the trench 133 may have a phase difference of 180 degrees with respect to the second transmission light 223 penetrating the second transfer pattern 132.

As described above, because the amount of the first transmission light 213 penetrating the first transfer pattern 131 is about 6% of the amount of the first incident light 211, the amount of the first transmission light 213 may not be sufficiently large to change a chemical structure of a photoresist layer. Meanwhile, the amount of the second transmission light 223 penetrating each second transfer pattern 132 may be within the range of about 10% to about 40% of the amount of the second incident light 221, and most of the third incident light 231 obliquely irradiated toward each trench 133 may penetrate the light transmission substrate 101 to produce the third transmission light 233. Accordingly, the amount of the second transmission light 223 and the amount of the third transmission light 233 may be sufficiently large to change the chemical structure of the photoresist layer, respectively. However, because the third transmission light 233 may have the phase difference of 180 degrees with respect to the second transmission light 223, the third transmission light 233 penetrating the trench 133 may be offset by the second transmission light 223 penetrating the second transfer pattern 132 adjacent to the trench 133, and vice versa. As a result, due to the interference between the transmission lights 223 and 233, the second transmission light 223 and the third transmission light 233 may not change the chemical structure of the photoresist layer. Accordingly, because the first to third incident lights 211, 221 and 231 obliquely irradiated onto the pattern region 111 do not change the chemical structure of the photoresist layer, a corresponding shape of the pattern region 111 may be transferred onto the photoresist layer. In each of the pattern regions 111, as seen from the plan view of FIG. 2, a planar area of the first transfer pattern 131 may be less than a combined planar area of the second transfer patterns 132 and the trenches 133. Because a first portion of the transfer pattern 130 corresponding to the first transfer pattern 131 absorbs an intensity of light (i.e., an amount of energy per a planar area) greater than that of a second portion of the transfer pattern 130 corresponding to the second transfer patterns 132 and the trenches 133, a total amount of the light absorbed into the pattern region 111 (i.e., the transfer pattern 130 of FIG. 2) may be reduced compared to a conventional pattern region that is entirely covered with a pattern that has the same material and the thickness T1 as the first transfer pattern 131. Due to the reduced amount of the light absorbed into the transfer pattern 130, a thermal stress applied to the photomask 100 is also reduced.

In some embodiments, because the amount of the light absorbed into the transfer pattern 130 is reduced, it may be possible to reduce a total amount of the light emitted from the light source. This may also lead to reduction in a thermal stress applied to a lens module that is disposed between the photomask 100 and the wafer and loaded in the exposure apparatus.

Figure 5:
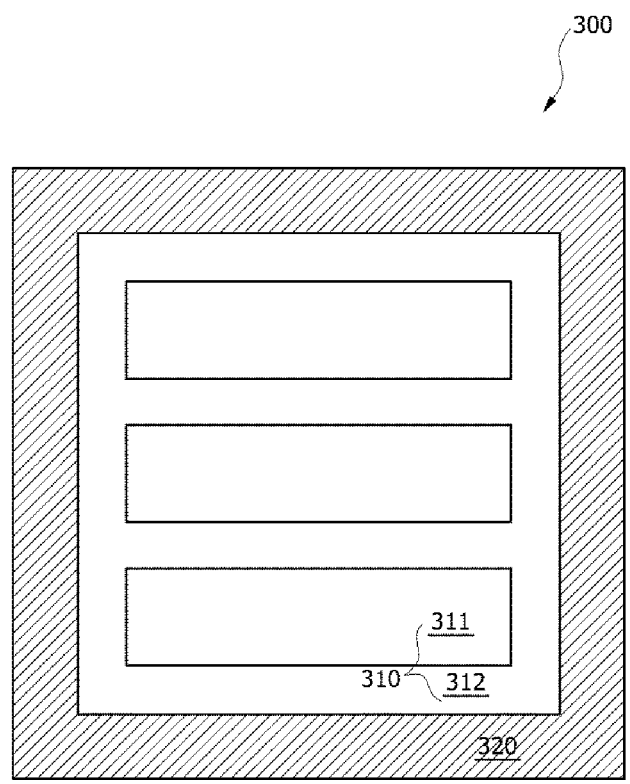
FIG. 5 is a plan view illustrating a photomask according to a second embodiment.

FIG. 5 is a plan view illustrating a photomask 300 according to a second embodiment. Referring to FIG. 5, the photomask 300 may include a transfer region 310 and a frame region 320 surrounding the transfer region 310. The transfer region 310 may be defined as a region including patterns whose shapes are transferred onto a wafer by an exposure process. The frame region 320 may be a region corresponding to a border region between adjacent shot areas (or adjacent chip areas), in order to prevent process errors due to an unnecessary exposure of the border region. The transfer region 310 may include a plurality of pattern regions 311 and a light transmitting region 312 surrounding the pattern regions 311. Each of the plurality of pattern regions 311 may extend in a first direction (e.g., a horizontal direction with respect to the orientation of FIG. 5). The plurality of pattern regions 311 may be arranged in a second direction (e.g., a vertical direction with respect to the orientation of FIG. 5) such that adjacent pattern regions 311 may be spaced apart from each other. In the embodiment shown in FIG. 5, the plurality of pattern regions 311 may have the same size, and the adjacent pattern regions 311 are spaced apart from each other by the same distance. In other embodiments, the plurality of pattern regions 311 may have different sizes, and distances between the adjacent pattern regions 311 may also be different from each other.

In the embodiment shown in FIG. 5, a dark field pattern may be disposed in each of the pattern regions 311 to act as a transfer pattern. If the photomask 300 is a binary photomask, the dark field pattern may be a light blocking pattern that includes Cr. If the photomask 300 is a phase shift photomask, the dark field pattern may be a phase shift pattern that includes MoSi. A first portion of a light transmission substrate of the photomask 300 corresponding to the light transmitting region 312 may not be covered with a light blocking layer. A second portion of the light transmission substrate in the frame region 320 may be covered with the light blocking layer such as a Cr layer. If the dark field patterns are disposed in the pattern regions 311 of the photomask 300, the photomask 300 may be used in a photolithography process for transferring shapes of the dark field patterns onto a negative photoresist layer formed on the wafer.

In order to transfer a shape of a transfer pattern disposed in each of the pattern regions 311 onto the wafer, the photomask 300 may be first loaded into an exposure apparatus. In an embodiment, the photomask 300 may be accurately located at a predetermined position in the exposure apparatus using overlay patterns, for example, pre-alignment keys of the photomask 300. The photomask 300 may be disposed between a light source and the wafer. The light source may emit light on the photomask 300. Most of light irradiated onto the pattern regions 311 may be blocked by the transfer patterns disposed in the pattern regions 311. In contrast, most of light irradiated onto the light transmitting region 312 may be transmitted through the photomask 300 to reach a negative photoresist layer coated on the wafer. Portions of the negative photoresist layer exposed to the portion of the light transmitted through the photomask 300 may be chemically cross-linked and polymerized to have a chemical structure that is not dissolved by a developer. On the contrary, other portions of the negative photoresist layer corresponding to the pattern regions 311 may not be directly exposed to the light. Thus, the other portions of the negative photoresist layer corresponding to the pattern regions 311 may maintain the original chemical structure of the negative photoresist layer that is readily dissolved by the developer. Accordingly, if the negative photoresist layer is developed using the developer after the exposure process, the other portions of the negative photoresist layer corresponding to the pattern regions 311 may be selectively removed to form a photoresist pattern exposing portions of an etch target layer disposed under the negative photoresist layer. Subsequently, an etch process may be performed on the etch target layer using the photoresist pattern as an etch mask, thereby forming holes in the etch target layer. The holes formed in etch target layer may correspond to the pattern regions 311 of the photomask 300, and thus the shapes of the transfer patterns in the pattern regions 311 may be transferred on the wafer disposed below the etch target layer.

Figure 6:
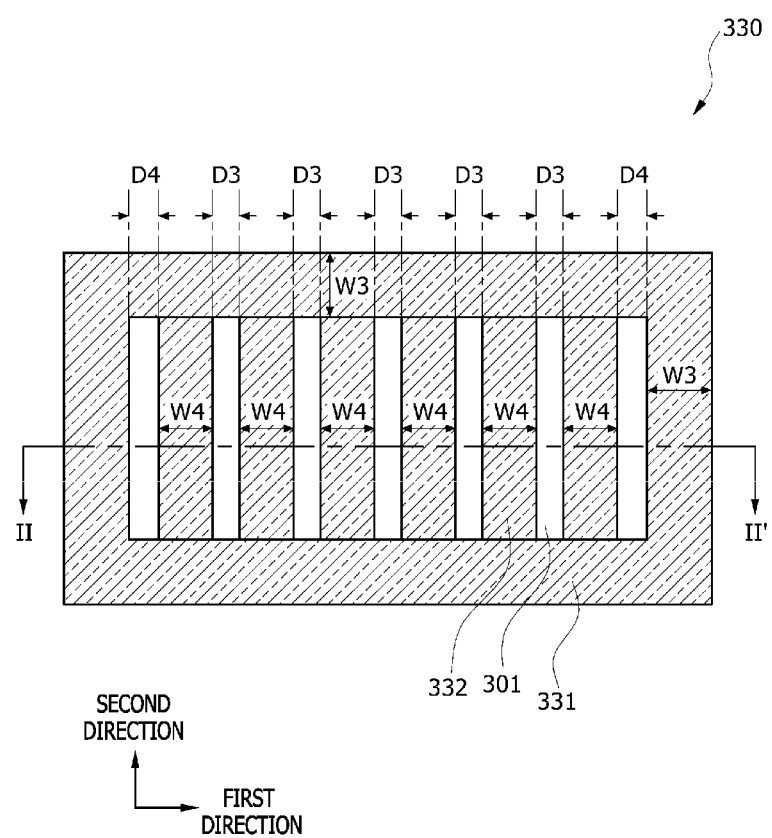
FIG. 6 is a plan view illustrating a transfer pattern of the photomask shown in FIG. 5 according to an embodiment.
Figure 7:
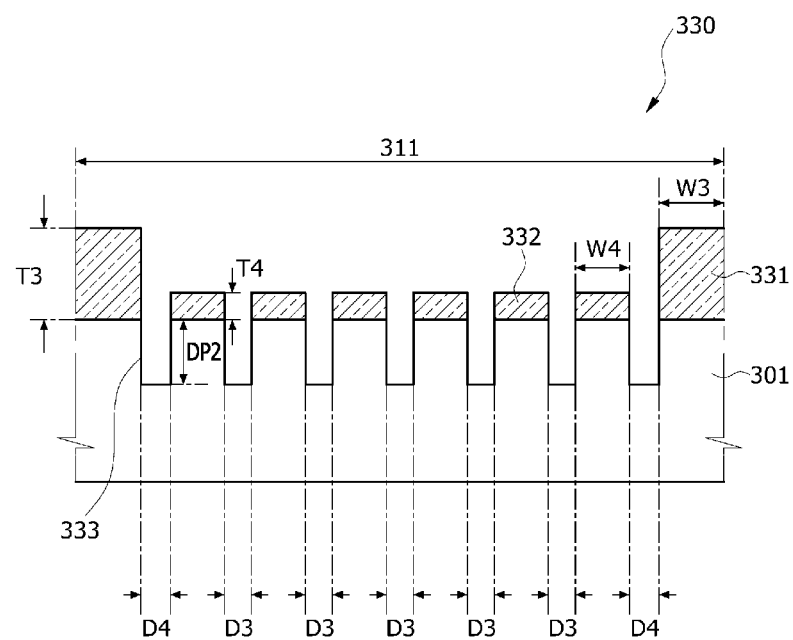
FIG. 7 is a cross-sectional view taken along a line II-II' of FIG. 6.

FIG. 6 is a plan view illustrating a transfer pattern 330 disposed in one of the pattern regions 311 of the photomask 300 shown in FIG. 5 according to an embodiment, and FIG. 7 is a cross-sectional view taken along a line II-II' of FIG. 6. Referring to FIGS. 6 and 7, the transfer pattern 330 may be disposed on a portion of a light transmission substrate 301 corresponding to any one of the pattern regions 311 of the photomask 300 of FIG. 5, as described above with reference to FIG. 5. The transfer pattern 330 may include a first transfer pattern 331 and a plurality of second transfer patterns 332. The first transfer pattern 331 may have a rectangular closed loop shape when viewed in a plan view and may have a uniform width W3. For example, the uniform with W3 corresponds to a length of the first transfer pattern 331 in a direction perpendicular to the longitudinal direction of the first transfer pattern 331. A length of the first transfer pattern 331 in a first direction (e.g., a horizontal direction with respect to the orientation of FIG. 6) may be greater than a length of the first transfer pattern 331 in a second direction (e.g., a vertical direction with respect to the orientation of FIG. 6). The second transfer patterns 332 may be disposed in an opening surrounded by the first transfer pattern 331 and may be arrayed in the first direction such that adjacent second transfer patterns 332 are spaced apart from each other by a first distance D3. Each of the second transfer patterns 332 may have a width W4 in the first direction. In an embodiment, the width W4 may be substantially equal to the width W3 of the first transfer pattern 331. Each of two outermost transfer patterns among the second transfer patterns 332 may be spaced apart from a corresponding one of two bar-shaped portions of the first transfer pattern 331 extending in the second direction by a second distance D4. The second transfer patterns 332 may have a stripe shape when viewed in a plan view. Both ends of each second transfer pattern 332 may contact a second pair of bar-shaped portions of the first transfer pattern 331 extending in the first direction, respectively. In an embodiment, the first distance D3 between adjacent second transfer patterns 332 may be substantially equal to the second distance D4.

The first transfer pattern 331 may be disposed on a first portion of the light transmission substrate 301 and have a first thickness T3. Each of the second transfer patterns 332 may be disposed on a corresponding one of second portions of the light transmission substrate 301 and have a second thickness T4. The second thickness T4 may be less than the first thickness T3. In some embodiments, the second thickness T4 may be within a range of about 5% to about 80% of the first thickness T3. If the second thickness T4 decreases, an intensity or an amount of light transmitted through the second transfer patterns 332 may increase while that of light absorbed into the second transfer patterns 332 may decrease. In some embodiments, if the second thickness T4 is about 5% of the first thickness T3, the intensity of light transmitted through the second transfer patterns 332 may be about 40% of a total intensity of light incident on the second transfer patterns 332. If the second thickness T4 is about 80% of the first thickness T3, the intensity of light transmitted through the second transfer patterns 332 may be about 10% of the total intensity of light incident on the second transfer patterns 332. If the intensity of light transmitted through the second transfer patterns 332 is greater than a predetermined upper limit value, a portion of the light transmitted through the second transfer patterns 332 that reaches a wafer may be too excessive, thereby causing an error in pattern transfer. Meanwhile, if the intensity of light transmitted through the second transfer patterns 332 is less than a predetermined lower limit value, an amount of energy absorbed into the second transfer patterns 332 increases, and thus a thermal stress applied to the photomask 300 may also increase. In some embodiments, the second transfer patterns 332 are implemented to have the second thickness T4 that is within a range of about 5% to about 50% of the first thickness T3. In these embodiments, the intensity of light transmitted through the second transfer patterns 332 may be within a range of about 20% to about 40% of the total intensity of light incident on the second transfer patterns 332.

Trenches 333 having a depth DP2 may be disposed in the light transmission substrate 301. Specifically, each of the trenches 333 is disposed in a gap region between adjacent second transfer patterns 332 or between an outermost second transfer pattern 332 and a bar-shaped portion of the first transfer pattern 331 extending in the second direction. Internal portions of the light transmission substrate 301 may be exposed by the trenches 333. A phase of light penetrating the trenches 333 may vary the depth DP2 of the trenches 333. In some embodiments, the depth DP2 of the trenches 333 may be determined such that a phase difference between first light penetrating the trenches 333 and a first corresponding portion of the substrate 301 and second light penetrating the second transfer patterns 332 and a second corresponding portion of the substrate 301 is substantially equal to 180 degrees. In some embodiments, the light transmission substrate 301 may be a quartz substrate. In some embodiments, the first and second transfer patterns 331 and 332 may be light blocking patterns that include Cr. Alternatively, the first and second transfer patterns 331 and 332 may be phase shift patterns that include MoSi.

Figure 8:
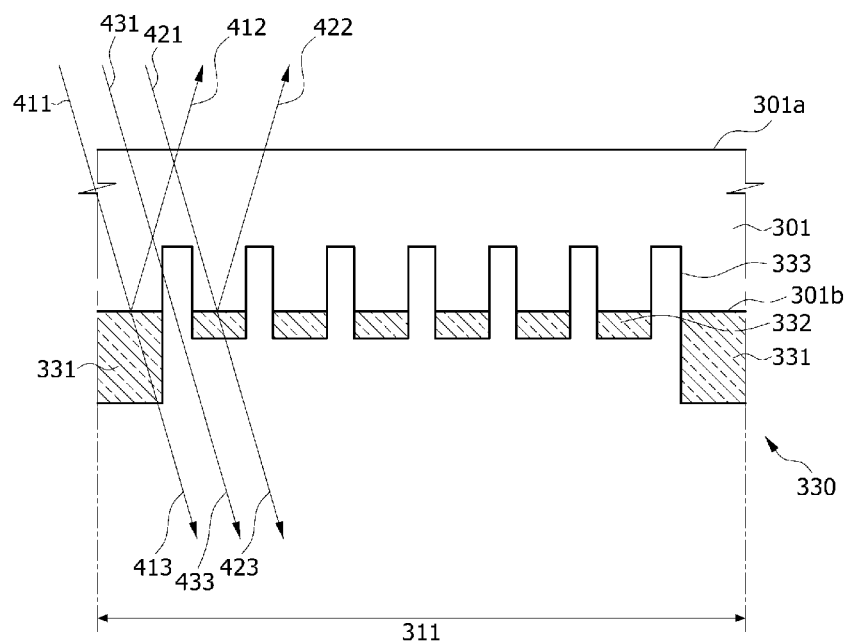
FIG. 8 is a cross-sectional view illustrating a mechanism that reduces an amount of light absorbed into the transfer pattern shown in FIGS. 6 and 7.

FIG. 8 is a cross-sectional view illustrating a mechanism that reduces an amount of light absorbed into the transfer pattern 330 shown in FIGS. 6 and 7. In FIG. 8, the same reference numerals as used in FIGS. 6 and 7 denote the same elements. The photomask 300 of FIG. 5 may be loaded into an exposure apparatus (not shown). In the embodiment shown in FIG. 8, the photomask 300 may be located in the exposure apparatus such that a bottom surface 301a of the light transmission substrate 301 opposite to a top surface 301b on which the transfer pattern 330 is disposed faces a light source of the exposure apparatus and the transfer pattern 330 disposed on the top surface 301b of the light transmission substrate 301 faces a wafer loaded into the exposure apparatus. Light emitted from the light source may be uniformly irradiated onto the bottom surface 301a of the light transmission substrate 301 of the photomask 300, and a portion of the light irradiated onto the bottom surface 301a of the light transmission substrate 301 may penetrate the light transmission substrate 301. If the exposure apparatus employs an off-axis illumination system, the light emitted from the light source may be obliquely irradiated onto the photomask 300 through an aperture. Although not shown in FIG. 8, the light obliquely irradiated onto the light transmitting region 312 of FIG. 5 may penetrate the light transmission substrate 301 to reach the wafer. Meanwhile, as illustrated in FIG. 8, the light irradiated toward the transfer pattern 330 may be categorized into three kinds of light, for example, first incident light 411, second incident light 421 and third incident light 431. The first incident light 411 may be obliquely irradiated toward the first transfer pattern 331, the second incident light 421 may be obliquely irradiated toward the second transfer patterns 332, and the third incident light 431 may be obliquely irradiated toward the trenches 333.

The light incident on the pattern region 311 is desirable not to change an original chemical structure of a photoresist layer, for example, a negative photoresist layer coated on the wafer. A portion of the first incident light 411 obliquely irradiated toward the first transfer pattern 331 may be transmitted through a corresponding portion of the light transmission substrate 301. For example, an amount or intensity of the transmitted portion of the first incident light 411 may be substantially equal to that of the first incident light 411 incident on a bottom surface 301a of the substrate 301. A first portion of the first incident light 411 may be reflected at an interface between the light transmission substrate 301 and the first transfer pattern 331 to produce first reflected light 412, a second portion of the first incident light 411 may be transmitted through the light transmission substrate 301 and the first transfer pattern 331 to produce first transmission light 413, and a third portion of the first incident light 411 may be absorbed into the first transfer pattern 331.

An amount of the first reflected light 412 may be determined according to a material of the first transfer pattern 331 and may be about 5% to about 50% of an amount of the first incident light 411. In an embodiment, the amount of the first reflected light 412 may be about 10% of the amount of the first incident light 411. An amount of the transmission light 413 may be determined according to a material and a thickness of the first transfer pattern 331. In some embodiments, an amount of the first transmission light 413 may be about 6% of the amount of the first incident light 411. An amount of the light absorbed into the first transfer pattern 331 may be determined by subtracting the amount of the first reflected light 412 and the amount of the first transmission light 413 from the amount of the first incident light 411 transmitted through the light transmission substrate 101. In some embodiments, the amount of the light absorbed into the first transfer pattern 331 may be about 84% of the amount of the first incident light 411.

A portion of the second incident light 421 obliquely irradiated toward each second transfer pattern 332 may be transmitted through a corresponding portion of the light transmission substrate 301. For example, the amount of the transmitted portion of the second incident light 421 is substantially equal to that of the second incident light 421 incident on the bottom surface 301a of the substrate 301. A first portion of the second incident light 421 may be reflected at an interface between the light transmission substrate 301 and the second transfer pattern 332 to produce second reflected light 422, a second portion of the second incident light 421 may be transmitted through the light transmission substrate 301 and the second transfer pattern 332 to produce second transmission light 423, and a third portion of the second incident light 421 may be absorbed into the second transfer pattern 332. An amount of the second reflected light 422 may be determined according to a material of the second transfer patterns 332. In some embodiments, if the second transfer patterns 332 are comprised of the same material as the first transfer pattern 331, an amount of the second reflected light 422 may be about 10% of an amount of the second incident light 421 like the first reflected light 412. An amount of the second transmission light 423 may be determined according to the material and a thickness of the second transfer patterns 332. In some embodiments, if the second transfer patterns 332 are comprised of the same material as the first transfer pattern 331 and the thickness of the second transfer patterns 332 is within a range of about 5% to about 80% of a thickness of the first transfer pattern 331, an amount of the second transmission light 423 may be within a range of about 10% to about 40% of the amount of the second incident light 421. An amount of the light absorbed into the second transfer pattern 332 may be determined by subtracting the amount of the second reflected light 422 and the amount of the second transmission light 423 from the amount of the second incident light 421 transmitted through the light transmission substrate 301, and thus the amount of the light absorbed into the second transfer pattern 332 may be within a range of about 50% to about 80% of the amount of the second incident light 421.

Alternatively, if the second transfer patterns 332 are comprised of the same material as the first transfer pattern 331 and the thickness of the second transfer patterns 332 is within a range of about 5% to about 50% of the thickness of the first transfer pattern 331, the amount of the second transmission light 423 may be within a range of about 20% to about 40% of the amount of the second incident light 421. In such a case, the amount of the light absorbed into the second transfer pattern 332 may be within a range of about 50% to about 70% of the amount of the second incident light 421. Thus, the amount of the light absorbed into the second transfer pattern 332 may be less than that of the light absorbed into the first transfer pattern 331 because of a difference between the thickness of the first transfer pattern 331 and the thickness of the second transfer pattern 332. In addition, the amount of the light absorbed into the second transfer pattern 332 per a planar area of the second transfer pattern 332, as seen from the plan view of FIG. 6, may be less than that of the light absorbed into the first transfer pattern 331 per a planar area of the first transfer pattern 331.

The third incident light 431 obliquely irradiated toward each trench 333 may penetrate the light transmission substrate 301 to produce third transmission light 433. The second transfer pattern 332 adjacent to the trench 333 is sufficiently thin that the third incident light 431 is neither reflected by nor absorbed into the adjacent second transfer pattern 332. The transmission light 433 penetrating the trench 333 may have a phase difference of 180 degrees with respect to the transmission light 423 penetrating the second transfer pattern 332. As described above, because the amount of the first transmission light 413 penetrating the first transfer pattern 331 is about 6% of the amount of the first incident light 411, the amount of the transmission light 413 may not be sufficiently large to change a chemical structure of a photoresist layer. Meanwhile, the amount of the transmission light 423 penetrating each second transfer pattern 332 may be within the range of about 10% to about 40% of the amount of the second incident light 421, and most of the third incident light 431 obliquely irradiated toward each trench 333 may penetrate the light transmission substrate 301 to produce the third transmission light 433. Accordingly, the amount of the second transmission light 423 and the third transmission light 433 may be sufficiently large to change the chemical structure of the photoresist layer, respectively. However, because the third transmission light 433 may have the phase difference of 180 degrees with respect to the second transmission light 423 penetrating the second transfer pattern 332, the third transmission light 433 may be offset by the second transmission light 423, and vice versa. As a result, due to the interference between the transmission lights 223 and 233, the second transmission light 423 and the third transmission light 433 may not change the chemical structure of the photoresist layer. Accordingly, because the first to third incident lights 411, 421 and 431 obliquely irradiated onto the pattern region 311 do not change the chemical structure of the photoresist layer, a corresponding shape of the pattern region 311 may be transferred onto the photoresist layer. In each of the pattern regions 311, as shown in the plan view of FIG. 6, a planar area of the first transfer pattern 331 may be less than a combined planar area of the second transfer patterns 332 and the trenches 333. Because a first portion of the transfer pattern 330 corresponding to the first transfer pattern 331 absorbs an intensity of light (i.e., an amount of energy per a planar area) greater than that of a second portion of the transfer pattern 330 corresponding to the second transfer patterns 332 and the trenches 333, a total amount of the light absorbed into the pattern region 311 (i.e., the transfer pattern 330 of FIG. 6) may be reduced compared to a conventional pattern region that is entirely covered with a pattern that has the same material and the thickness T3 as the first transfer pattern 331. Due to the reduced amount of the light absorbed into the transfer pattern 330, a thermal stress applied to the photomask 300 is also reduced. In some embodiments, because the amount of the light absorbed into the transfer pattern 330 is reduced, it may be possible to reduce a total amount of the light emitted from the light source. This may also lead to reduction in of a thermal stress applied to a lens module that is disposed between the photomask 300 and the wafer and are loaded in the exposure apparatus.

Figure 9:
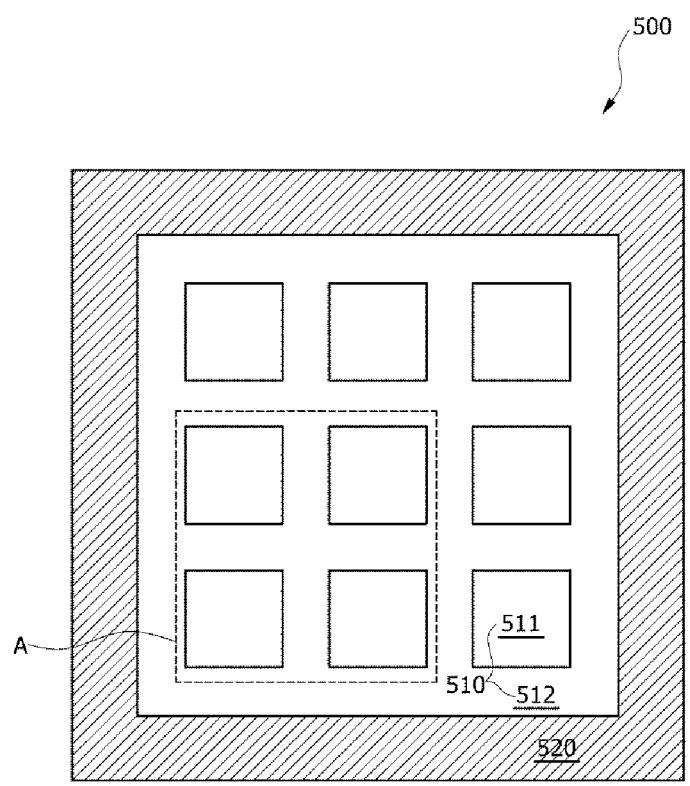
FIG. 9 is a plan view illustrating a photomask according to a third embodiment.

FIG. 9 is a plan view illustrating a photomask 500 according to a third embodiment. Referring to FIG. 9, the photomask 500 may include a transfer region 510 and a frame region 520 surrounding the transfer region 510. The transfer region 510 may be defined as a region including patterns whose shapes are transferred onto a wafer by an exposure process. The frame region 520 may be a region corresponding to a border region between adjacent shot areas (or adjacent chip areas), in order to prevent process errors due to an unnecessary exposure of the border region. The transfer region 510 may include a plurality of pattern regions 511 and a light blocking region 512 surrounding the pattern regions 511. The plurality of pattern regions 511 may be arranged in a matrix form to be spaced apart from each other by a predetermined distance. In the embodiment shown in FIG. 9, the plurality of pattern regions 511 may have the same size, and a distance between adjacent pattern regions 511 in a first direction (e.g., a horizontal direction with respect to the orientation of FIG. 9) may be equal to a distance between adjacent pattern regions 511 in a second direction (e.g., a vertical direction with respect to the orientation of FIG. 9). In other embodiments, the plurality of pattern regions 511 may have different sizes, and distances between adjacent pattern regions 511 in the first and second directions may also be different from each other.

In the embodiment shown in FIG. 9, each of the pattern regions 511 may include a transfer pattern for forming a hole-shaped pattern such as a contact hole on a wafer. Each of the pattern regions 511 may have a tetragonal shape, but embodiments of the present disclosure are not limited thereto. In some embodiments, each of the pattern regions 511 may have a circular shape when viewed in a plan view. A bright field pattern may be disposed in each of the pattern regions 511 to act as a transfer pattern. The bright field pattern may be configured to expose a surface of a light transmission substrate. A first portion of the light transmission substrate corresponding to the light blocking region 512 may be covered with a light blocking pattern or a phase shift pattern. A second portion of the light transmission substrate corresponding to each pattern region 511 may be exposed to light emitted from a light source. The light transmission substrate in the frame region 520 may be covered with a light blocking layer such as a Cr layer. If the bright field patterns are disposed in the pattern regions 511 of the photomask 500, the photomask 500 may be used in a photolithography process for transferring shapes of the bright field patterns onto a positive photoresist layer formed on a wafer.

In order to transfer a shape of a transfer pattern disposed in each of the pattern regions 511 onto the wafer, the photomask 500 may be first loaded into an exposure apparatus. In an embodiment, the photomask 500 may be accurately located at a predetermined position in the exposure apparatus using overlay patterns, for example, pre-alignment keys of the photomask 500.

The photomask 500 may be disposed between the light source and the wafer. The light source may emit light on the photomask 500. Most of light incident on the pattern regions 511 may be transmitted through corresponding portions of the light transmission substrate to reach a positive photoresist layer coated on the wafer. In contrast, most of light incident on the light blocking region 512 may be blocked by the light blocking pattern disposed in the light blocking region 512. Portions of the positive photoresist layer exposed to the portion of the light transmitted through the pattern regions 511 may chemically react on the light to be readily dissolved by a developer. On the contrary, other portions of the positive photoresist layer corresponding to the light blocking region 512 may be hardly exposed to the light even though the light is irradiated onto the light blocking region 512. Thus, the other portions of the positive photoresist layer corresponding to the light blocking region 512 may maintain an original chemical structure of the positive photoresist layer that is hardly dissolved by the developer. Accordingly, if the positive photoresist layer is developed using the developer after the exposure process, the portions of the positive photoresist layer corresponding to the pattern regions 511 may be selectively removed to form a photoresist pattern exposing portions of an etch target layer disposed under the positive photoresist layer. Subsequently, an etch process may be performed on the etch target material layer using the photoresist pattern as an etch mask, thereby forming holes in the etch target layer. The holes formed in the etch target layer may correspond to the pattern regions 511 of the photomask 500 are transferred, and thus the shapes of the transfer patterns in the pattern regions 511 may be transferred on the wafer disposed below the etch target layer.

Figure 10:
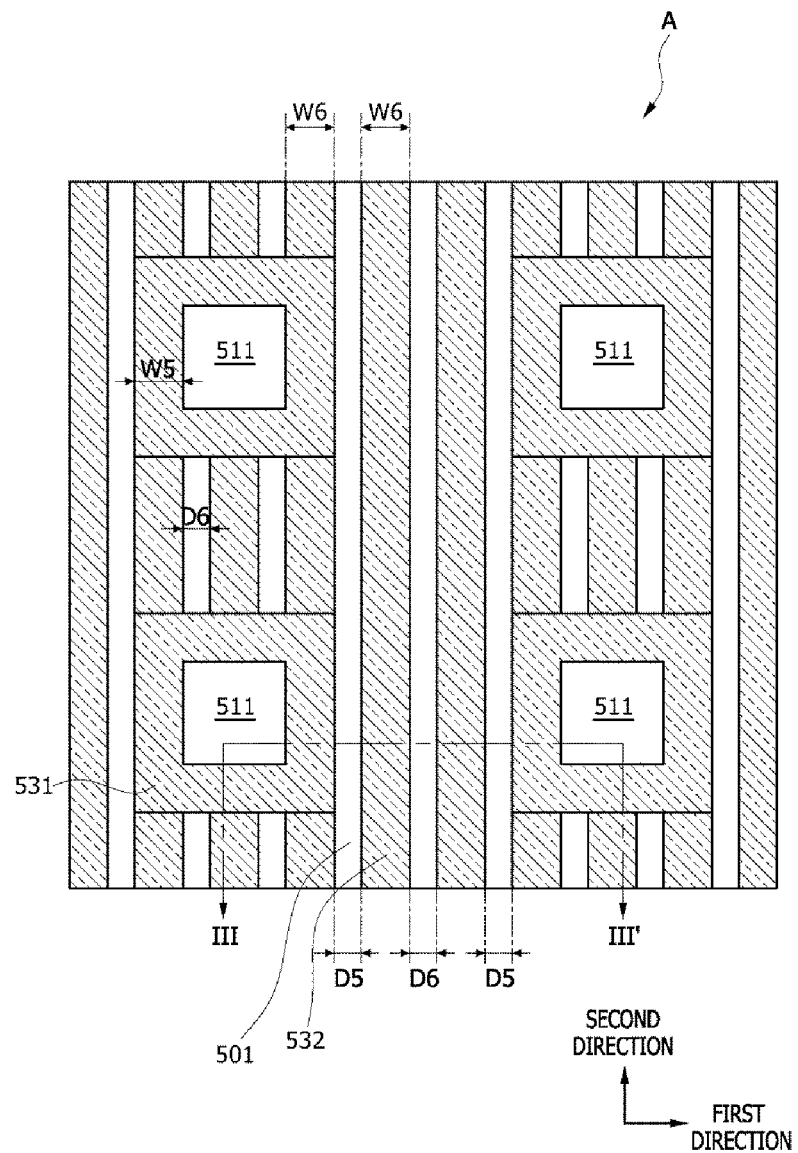
FIG. 10 is an enlarged view of a portion 'A' of FIG. 9.
Figure 11:
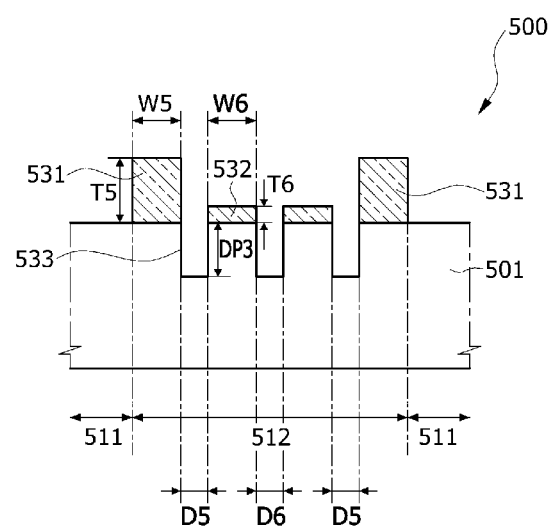
FIG. 11 is a cross-sectional view taken along a line III-III' of FIG. 10.

FIG. 10 is an enlarged view of a portion 'A' of FIG. 9, and FIG. 11 is a cross-sectional view taken along a line III-III' of FIG. 10. Referring to FIGS. 10 and 11, first light blocking patterns 531 and second light blocking patterns 532 may be disposed in a portion of the light blocking region 512 surrounding the pattern regions 511. Each of the first light blocking patterns 531 may be disposed to surround a corresponding one of the pattern regions 511. Each of the first light blocking patterns 531 may have a rectangular closed loop shape when viewed in a plan view and may have a uniform width W5. For example, the uniform with W5 corresponds to a length of the first light blocking pattern 531 in a direction perpendicular to the longitudinal direction of the first transfer pattern 531. That is, each of the pattern regions 511 may be exposed by a rectangular opening that is surrounded by one of the first light blocking patterns 531. The second light blocking patterns 532 may be arrayed in a first direction (e.g., a horizontal direction with respect to the orientation of FIG. 10) to be spaced apart from each other by a first distance D6, and each of the second light blocking patterns 532 may have a width W6 in the first direction. The width W6 of the second light blocking patterns 532 in the first direction may be substantially equal to the width W5 of first light blocking patterns 531. The first light blocking patterns 531 may be spaced apart from the second light blocking patterns 532 adjacent to the first light blocking patterns 531 by a second distance D5 in the first direction. Each of the second light blocking patterns 532 may extend in a second direction (e.g., a vertical direction with respect to the orientation of FIG. 10) intersecting the first direction to have a stripe shape when viewed in a plan view. Some of the second light block patterns 532 are disposed between adjacent first light blocking patterns 531 in the second direction such that both ends of each of the second light blocking patterns 532 may contact corresponding first light blocking patterns 531. In an embodiment, the first distance D6 between adjacent second light blocking patterns 532 may be substantially equal to the second distance D5.

Each of the first light blocking patterns 531 may be disposed on a first portion of a light transmission substrate 501 to have a first thickness T5. The second light blocking patterns 532 may be disposed on a corresponding one of second portions of the light transmission substrate 501 and have a second thickness T6. The second thickness T6 may be less than the first thickness T5. In some embodiments, the second thickness T6 may be within a range of about 5% to about 80% of the first thickness T5. If the second thickness T6 decreases, an intensity or an amount of light transmitted through the second light blocking patterns 532 may increase while that of light absorbed into the second light blocking patterns 532 may decrease. In some embodiments, if the second thickness T6 is about 5% of the first thickness T5, the intensity of light transmitted through the second light blocking patterns 532 may be about 40% of a total intensity of light incident on the second light blocking patterns 532. If the second thickness T6 is about 80% of the first thickness T5, the intensity of light transmitted through the second light blocking patterns 532 may be about 10% of the total intensity of light incident on the second light blocking patterns 532. If the intensity of light transmitted through the second light blocking patterns 532 is greater than a predetermined upper limit value, a portion of light transmitted through the second light blocking patterns 532 that reaches a wafer may be too excessive to cause an error in pattern transfer. Meanwhile, if the intensity of the transmitted portion of light through the second light blocking patterns 532 is less than a predetermined lower limit value, an amount of energy absorbed into the second light blocking patterns 532 increases, and thus a thermal stress applied to the photomask 500 may also increase. In some embodiments, the second thickness T6 may be within a range of about 5% to about 50% of the first thickness T5. In these embodiments, the intensity of light transmitted through the second light blocking patterns 532 may be within a range of about 20% to about 40% of the total intensity of light incident on the second light blocking patterns 532.

Trenches 533 having a depth DP3 may be disposed in the light transmission substrate 501. Specifically, each of the trenches 533 is disposed in a gap region between adjacent second light blocking patterns 532 or between a bar-shaped portion of a first light blocking pattern 531 and a second light blocking pattern 532 adjacent to the bar-shaped portion. Internal portions of the light transmission substrate 501 may be exposed by the trenches 533. A phase of light penetrating the trenches 533 may vary with the depth DP3 of the trenches 533. In some embodiments, the depth DP3 of the trenches 533 may be determined such that a phase difference between first light penetrating the trenches 533 and a first corresponding portion of the substrate 501 and second light penetrating the second light blocking patterns 532 and a second corresponding portion of the substrate 501 is substantially equal to 180 degrees. In some embodiments, the light transmission substrate 501 may be a quartz substrate. In some embodiments, the first and second light blocking patterns 531 and 532 may be Cr patterns. Alternatively, the first and second light blocking patterns 531 and 532 may be phase shift patterns that include MoSi.

Figure 12:
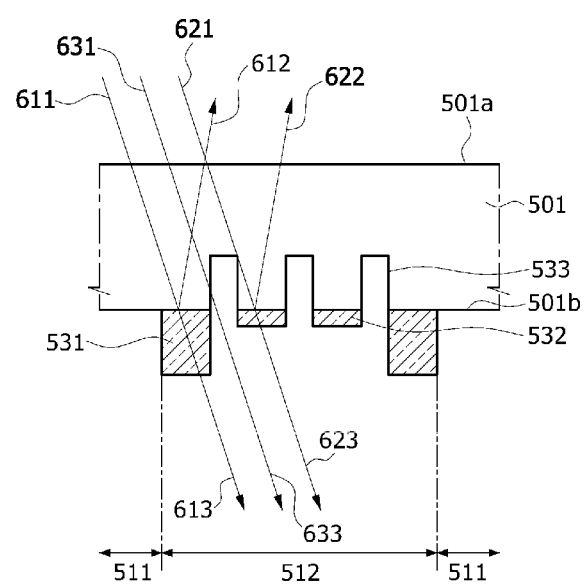
FIG. 12 is a cross-sectional view illustrating a mechanism that reduces an amount of a portion of light absorbed into a light blocking region shown in FIGS. 10 and 11.

FIG. 12 is a cross-sectional view illustrating a mechanism that reduces an amount of light absorbed into the light blocking regions 512 shown in FIGS. 10 and 11. In FIG. 12, the same reference numerals as used in FIGS. 10 and 11 denote the same elements.

The photomask 500 of FIG. 9 may be loaded into an exposure apparatus (not shown). In the embodiment shown in FIG. 12, the photomask 500 may be located in the exposure apparatus such that a bottom surface 501a of the light transmission substrate 501 opposite to a top surface 501b on which the first and second light blocking patterns 531 and 532 are disposed faces a light source of the exposure apparatus and the first and second light blocking patterns 531 and 532 disposed on the top surface 501b of the light transmission substrate 501 faces a wafer loaded into the exposure apparatus.

Light emitted from the light source may be uniformly irradiated onto the bottom surface 501a of the light transmission substrate 501 of the photomask 500, and a portion of the light irradiated onto the bottom surface 501a of the light transmission substrate 501 may penetrate the light transmission substrate 501. If the exposure apparatus employs an off-axis illumination system, the light emitted from the light source may be obliquely irradiated onto the photomask 500 through an aperture. Although not shown in FIG. 12, the light obliquely irradiated onto the pattern regions 511 may penetrate the light transmission substrate 501 to reach the wafer. Meanwhile, as illustrated in FIG. 12, the light obliquely irradiated toward the light blocking region 512 may be categorized into three kinds of light, for example, first incident light 611, second incident light 621 and third incident light 631. The first incident light 611 may be obliquely irradiated toward the first light blocking patterns 531, the second incident light 621 may be obliquely irradiated toward the second light blocking patterns 532, and the third incident light 631 may be obliquely irradiated toward the trenches 533.

The light incident on the light blocking region 512 is desirable not to change a chemical structure of a photoresist layer, for example, a positive photoresist layer coated on the wafer. For example, the amount or intensity of the transmitted portion of the first incident light 611 is substantially equal to that of the first incident light 611 incident on a bottom surface 501a of the substrate 501. A portion of the first incident light 611 obliquely irradiated toward each first light blocking pattern 531 may be transmitted through a corresponding portion of the light transmission substrate 501. A first portion of the first incident light 611 may be reflected at an interface between the light transmission substrate 501 and the first light blocking pattern 531 to produce first reflected light 612, a second portion of the first incident light 611 may be transmitted the first light blocking pattern 531 to produce first transmission light 613, and a third portion of the first incident light 611 may be absorbed into the first blocking pattern 531.

An amount of the first reflected light 612 may be determined according to a material of the first light blocking pattern 531 and may be about 5% to about 50% of an amount of the first incident light 611. In an embodiment, the amount of the first reflected light 612 may be about 10% of the amount of the first incident light 611. An amount of the transmission light 613 may be determined according to a material and a thickness of the first light blocking pattern 531. In some embodiments, an amount of the first transmission light 613 may be about 6% of the amount of the first incident light 611. An amount of the light absorbed into the first light blocking pattern 531 may be determined by subtracting the amount of the first reflected light 612 and the amount of the first transmission light 613 from the amount of the first incident light 611 transmitted through the light transmission substrate 501. In some embodiments, the amount of the light absorbed into the first light blocking pattern 531 may be about 84% of the amount of the first incident light 611.

A portion of the second incident light 621 obliquely irradiated toward each second light blocking pattern 532 may be transmitted through a corresponding portion of the light transmission substrate 501. For example, the amount of the transmitted portion of the second incident light 621 is substantially equal to that of the second incident light 621 incident on the bottom surface 501a of the substrate 501. A first portion of the second incident light 621 may be reflected at an interface between the light transmission substrate 501 and the second light blocking pattern 532 to produce second reflected light 622, a second portion of the second incident light 621 may be transmitted through the second light blocking pattern 532 to produce second transmission light 623, and a third portion of the second incident light 621 may be absorbed into the second light blocking pattern 532. An amount of the second reflected light 622 may be determined according to a material of the second light blocking pattern 532. In some embodiments, if the second light blocking patterns 532 are comprised of the same material as the first light blocking patterns 531, an amount of the second reflected light 622 may be about 10% of the amount of the second incident light 621 like the first reflected light 612. An amount of the second transmission light 623 may be determined according to the material and a thickness of the second light blocking patterns 532. In some embodiments, if the second light blocking patterns 532 are comprised of the same material as the first light blocking patterns 531 and the thickness of the second light blocking patterns 532 is within a range of about 5% to about 80% of a thickness of the first light blocking patterns 531, an amount of the second transmission light 623 may be within a range of about 10% to about 40% of the amount of the second incident light 621. An amount of the light absorbed into the second light blocking pattern 532 may be determined by subtracting the amount of the second reflected light 622 and the amount of the second transmission light 623 from the amount of the second incident light 621 transmitted through the substrate 501, and thus the amount of the light absorbed into the second light blocking pattern 532 may be within a range of about 50% to about 80% of the amount of the second incident light 621. Alternatively, if the second light blocking patterns 532 are comprised of the same material as the first light blocking patterns 531 and a thickness of the second light blocking patterns 532 is within a range of about 5% to about 50% of a thickness of the first light blocking patterns 531, an amount of the second transmission light 623 may be within a range of about 20% to about 40% of the amount of the second incident light 621. In such a case, the amount of the light absorbed into the second light blocking pattern 532 may be within a range of about 50% to about 70% of the amount of the second incident light 621. Thus, an amount of the light absorbed into the second light blocking pattern 532 may be less than that of the light absorbed into the first light blocking pattern 531 because of a difference between the thickness of the first light blocking pattern 531 and the thickness of the second light blocking pattern 532. In addition, the amount of the light absorbed into the second light blocking pattern 532 per a planar area of the second transfer pattern 532, as seen from the plan view of FIG. 10, may be less than that of the light absorbed into the first transfer pattern 531 per a planar area of the first light blocking pattern 531.

Most of the third incident light 631 obliquely irradiated toward each trench 533 may penetrate the light transmission substrate 501 to produce third transmission light 633. The second light blocking pattern 532 adjacent to the trench 533 is sufficiently thin that the third incident light 631 is neither reflected by nor absorbed into the adjacent second light blocking pattern 532. The third transmission light 633 penetrating the trench 533 may have a phase difference of 180 degrees with respect to the second transmission light 623 penetrating the second light blocking pattern 532. As described above, because the amount of the first transmission light 613 penetrating the first light blocking patterns 531 is about 6% of the amount of the first incident light 611, the amount of the first transmission light 613 may not be sufficiently large to change a chemical structure of a photoresist layer. Meanwhile, the amount of the second transmission light 623 penetrating each of the second light blocking patterns 532 may be within the range of about 10% to about 40% of the amount of the second incident light 621, and most of the third incident light 631 obliquely irradiated toward the trenches 533 may penetrate the light transmission substrate 501 to produce the third transmission light 633. Accordingly, the amount of the second transmission light 623 and the amount of the third transmission light 633 may be sufficiently large to change the chemical structure of the photoresist layer, respectively. However, because the third transmission light 633 may have the phase difference of 180 degrees with respect to the second transmission light 623, the third transmission light 633 penetrating the trench 533 may be offset by the second transmission light 623 penetrating the second light blocking pattern 532 adjacent to the trench 533, and vice versa. As a result, due to the interference between the transmission lights 623 and 633, the second transmission light 623 and the third transmission light 633 may not change the chemical structure of the photoresist layer. Accordingly, because the first to third incident lights 611, 621 and 631 obliquely irradiated onto the light blocking region 512 do not change the chemical structure of the photoresist layer, a corresponding shape of the light blocking region 512 may be transferred onto the photoresist layer. In the light blocking region 512, a total planar area of the first light blocking patterns 531 as seen from the plan view of FIG. 9, may be less than a total planar area of the second light blocking patterns 532 and the trenches 533. Because a first portion corresponding to the first light blocking patterns 531 absorbs an intensity of light (i.e., an amount of energy per a planar area) greater than that of a second portion corresponding to the second light blocking patterns 532 and the trenches 533, a total amount of the light absorbed into the light blocking region 512 (i.e., the light blocking patterns 531 and 532 of FIG. 10) may be reduced compared to a conventional light blocking region that is entirely covered with a pattern that has the same material and the thickness T5 as the first light blocking patterns 531. Due to the reduced amount of the light absorbed into the light blocking region 512, a thermal stress applied to the photomask 500 is also reduced. In some embodiments, because the amount of the light absorbed into the light blocking region 512 is reduced, it may be possible to reduce a total amount of the light emitted from the light source. This may also lead to reduction in a thermal stress applied to a lens module that is disposed between the photomask 500 and the wafer and loaded in the exposure apparatus.

Figure 13:
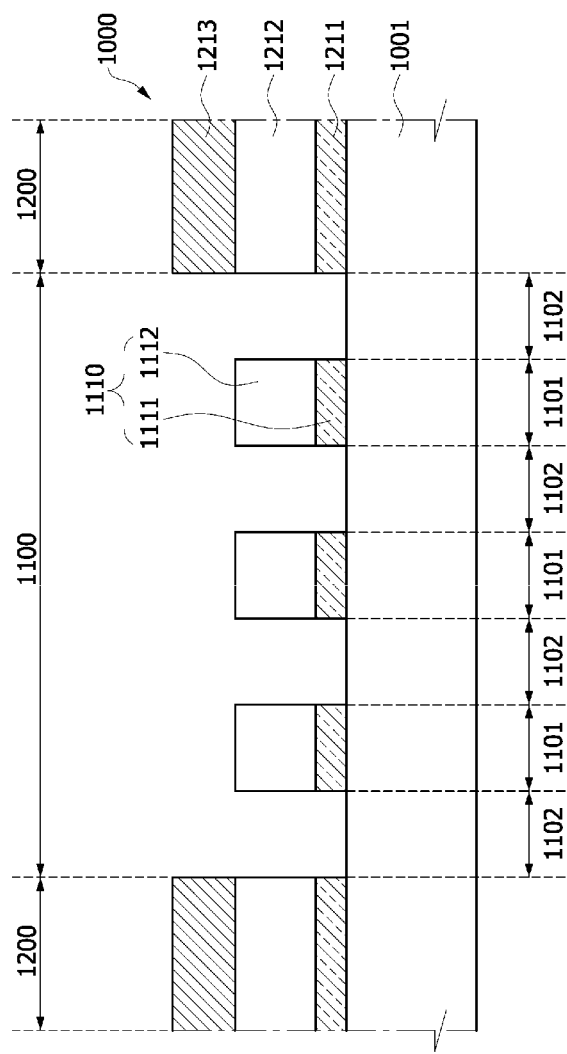
FIG. 13 is a cross-sectional view illustrating a photomask according to a fourth embodiment.

FIG. 13 is a cross-sectional view illustrating a photomask 1000 according to a fourth embodiment. Referring to FIG. 13, the photomask 1000 may correspond to a phase shift mask and may include a light transmission substrate 1001 having a transfer region 1100 and a frame region 1200. In some embodiments, the light transmission substrate 1001 may be a quartz substrate. Although not shown in the drawings, the frame region 1200 may be disposed to surround the transfer region 1100. The transfer region 1100 may be defined as a region having patterns whose shapes are transferred onto a wafer by an exposure process. The frame region 1200 may be a region corresponding to a border region between adjacent shot areas (or adjacent chip areas), in order to prevent process errors due to an unnecessary exposure of the border region.

A plurality of transfer patterns 1110 may be disposed on corresponding portions of the light transmission substrate 1001 in the transfer region 1100, respectively. The light transmission substrate 1001 may be exposed by a gap between adjacent transfer patterns 1110. The transfer region 1100 includes a plurality of pattern regions 1101 in which the transfer patterns 1110 are respectively disposed, and a light transmitting region 1102 surrounding the pattern regions 1101 and exposing the light transmission substrate 1001.

Each of the transfer patterns 1110 may include a first transmittance control pattern 1111 and a first phase difference control pattern 1112 which are sequentially stacked on a corresponding portion of the light transmission substrate 1001. The first phase difference control pattern 1112 may be disposed to be vertically aligned with the first transmittance control pattern 1111. In an embodiment, a sidewall of the first phase difference control pattern 1112 and a sidewall of the first transmittance control pattern 1111 form a substantially uniform surface profile in a direction perpendicular to a top surface of the light transmission substrate 1001.

The first transmittance control pattern 1111 may be provided to control an amount of light transmitted through each of the transfer patterns 1110. That is, the first transmittance control pattern 1111 may be provided to control an optical transmittance of each of the transfer patterns 1110. In an embodiment, the first transmittance control pattern 1111 may be provided so that each of the transfer patterns 1110 has an optical transmittance of about 5% to about 50%. The first transmittance control pattern 1111 may have a thin film structure. In some embodiments, the first transmittance control pattern 1111 may include a MoSi layer having a thickness of about 30 nanometers to about 50 nanometers. When a MoSi layer is used as a phase shift pattern of a conventional phase shift mask, the MoSi layer has a thickness of about 80 nanometers. In the embodiment shown in FIG. 13, if the first transmittance control pattern 1111 is formed of a MoSi layer, a thickness of the first transmittance control pattern 1111 may be approximately a half (e.g., 40 nm) of that of the MoSi layer used as the phase shift pattern of the conventional phase shift mask.

The first phase difference control pattern 1112 may include a material with a thickness sufficiently thin to have an optical transmittance of at least 85%, more specifically, at least 90%. When the first phase difference control pattern 1112 has a high optical transmittance over 90%, each of the transfer patterns 1110 may have an optical transmittance which is close to that of the first transmittance control pattern 1111. That is, the optical transmittance of the transfer pattern 1110 may be hardly affected by the presence of the first phase difference control pattern 1112. In some embodiments, the first phase difference control pattern 1112 may include a silicon oxide ($SiO_2$) layer having an optical transmittance of about 95%.

Light penetrating the first transmittance control pattern 1111 and the light transmission substrate 1001 may have a first phase difference with respect to light penetrating the light transmission substrate 1001. Light penetrating the first phase difference control pattern 1112 and the light transmission substrate 1001 may have a second phase difference with respect to the light penetrating the light transmission substrate 1001. Thus, light penetrating the transfer pattern 1110 and the light transmission substrate 1001 may have a phase difference corresponding to a sum of the first and second phase differences with respect to the light penetrating the light transmission substrate 1001.

The first phase difference may vary according to a material and a thickness of the first transmittance control pattern 1111. In an embodiment, the sum of the first and second phase differences is substantially equal to 180 degrees, and thus the second phase difference may be obtained by subtracting the first phase difference from 180 degrees. For example, if the first phase difference associated with the first transmittance control pattern 1111 is 80 degrees, the first phase difference control pattern 1112 may include a material with a thickness to have a phase difference of 100 degrees. In some embodiments, the first phase difference control pattern 1112 may have a thickness that is at least twice a thickness of the first transmittance control pattern 1111.

A light blocking pattern 1213 may be disposed over the light transmission substrate 1001 in the frame region 1200. In some embodiments, the light blocking pattern 1213 may include a Cr layer. A second transmittance control pattern 1211 and a second phase difference control pattern 1212 may be sequentially stacked over the light transmission substrate 1001 and disposed between the light transmission substrate 1001 and the light blocking pattern 1213. Since the light blocking pattern 1213 is provided as an uppermost pattern in the frame region 1200, most of light irradiated onto the light transmission substrate 1001 in the frame region 1200 may be blocked by the light blocking pattern 1213, regardless of the presence and thicknesses of the second transmittance control pattern 1211 and the second phase difference control pattern 1212. Thus, in some embodiments, the second transmittance control pattern 1211 and the second phase difference control pattern 1212 may be omitted.

If the photomask 1000 is fabricated using a photomask blank that includes a transmittance control layer, a phase difference control layer, and a light blocking layer which are sequentially stacked on the light transmission substrate 1001, the second transmittance control pattern 1211 may have the same material and the same thickness as the first transmittance control pattern 1111, and the second phase difference control pattern 1212 may have the same material and the same thickness as the first phase difference control pattern 1112.

Figure 14:
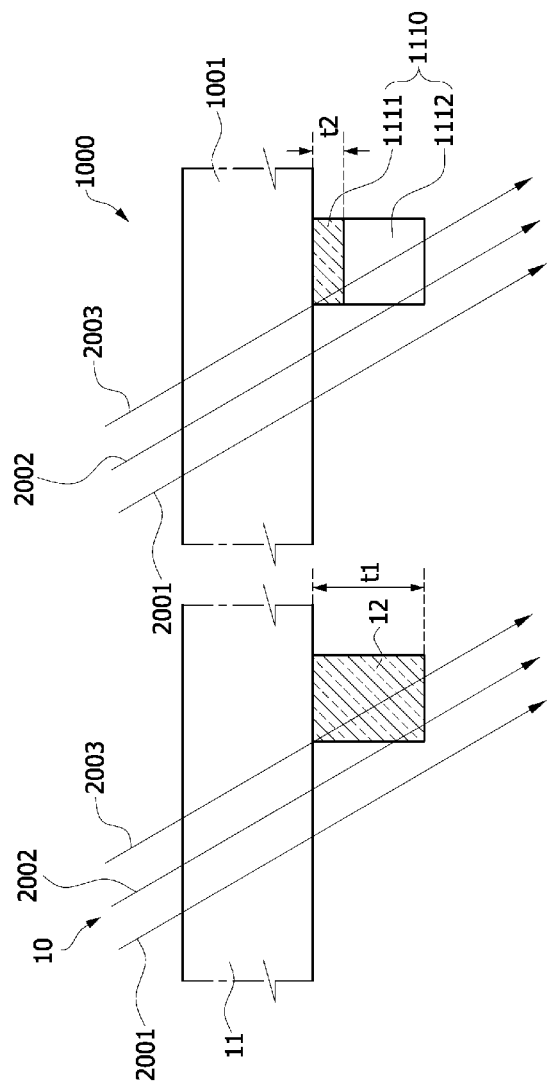
FIG. 14 is a cross-sectional view illustrating a mechanism that reduces a thermal stress generated by heat in the photomask of FIG. 13.

FIG. 14 is a cross-sectional view illustrating a mechanism that reduces a thermal stress generated by heat in the photomask 1000 of FIG. 13. In FIG. 14, the same reference numerals as used in FIG. 13 denote the same elements. Referring to FIG. 14, a conventional phase shift photomask 10 is shown on the left side of FIG. 14, and the photomask 1000 according to an embodiment is shown on the right side of FIG. 14. In the conventional phase shift photomask 10, a phase shift pattern 12 having a first thickness t1 is disposed on a surface of a light transmission substrate 11. In the embodiment shown on the right side of FIG. 14, the photomask 1000 includes the first transmittance control pattern 1111 having a second thickness t2 and the first phase difference control pattern 1112 which are sequentially stacked on a surface of the light transmission substrate 1001, as described with reference to FIG. 13. The first transmittance control pattern 1111 and the phase shift pattern 12 may include the same material, for example, MoSi. The second thickness t2 of the first transmittance control pattern 1111 may be equal to or smaller than a half of the first thickness t1 of the phase shift pattern 12.

As indicated by arrows in FIG. 14, first to third incident lights 2001, 2002 and 2003 may be obliquely irradiated onto a bottom surface of the conventional phase shift photomask 10, and the first to third incident lights 2001, 2002 and 2003 may also be obliquely irradiated onto a bottom surface of the photomask 1000. In the conventional phase shift photomask 10, the first incident light 2001 may penetrate the light transmission substrate 11 and reach a wafer (nor shown) while the second and third incident lights 2002 and 2003 may penetrate the light transmission substrate 11 and reach the phase shift pattern 12. The second incident light 2002 may be transmitted to a sidewall of the phase shift pattern 12, and the third incident light 2003 may be transmitted to an interface between the phase shift pattern 12 and the light transmission substrate 11. In the conventional phase shift photomask 10, most of the second and third incident lights 2002 and 2003 may be absorbed into the phase shift pattern 12. The light absorbed into the phase shift pattern 12 may increase a thermal stress of the conventional phase shift photomask 10 and cause an undesirable deformation of the conventional phase shift photomask 10. As a result, some process failures such as an overlay error may occur when an exposure process is performed using the conventional phase shift photomask 10.

In contrast, regarding the photomask 1000, the first transmittance control pattern 1111 may have the second thickness t2 which is less than the first thickness t1 of the phase shift pattern 12. Thus, the third incident light 2003 may be transmitted to the first transmittance control pattern 1111, and the second incident light 2002 may be transmitted to the first phase difference control pattern 1112. Since the first phase difference control pattern 1112 has a high optical transmittance over 90%, a light absorptivity of the first phase difference control pattern 1112 may be lower than a light absorptivity of the first transmittance control pattern 1111. Accordingly, the light absorbed into the first transmittance control pattern 1111 may dominantly cause a thermal stress applied to the photomask 1000. That is, while the second and third incident lights 2002 and 2003 absorbed into the phase shift pattern 12 of the conventional phase shift photomask 10 may generate a thermal stress applied to the conventional phase shift photomask 10, the third incident light 2003 absorbed into the first transmittance control pattern 1111 may dominantly generate a thermal stress applied to the photomask 1000 of the embodiment shown in FIG. 14. As a result, an amount of the light absorbed into the transfer pattern 1110 of the photomask 1000 may be less than an amount of the light absorbed into the phase shift pattern 12 of the conventional phase shift photomask 10. Thus, a thermal stress generated in the photomask 1000 of the embodiment shown in FIG. 14 may be reduced compared with that generated in the conventional phase shift photomask 10.

Figure 15:
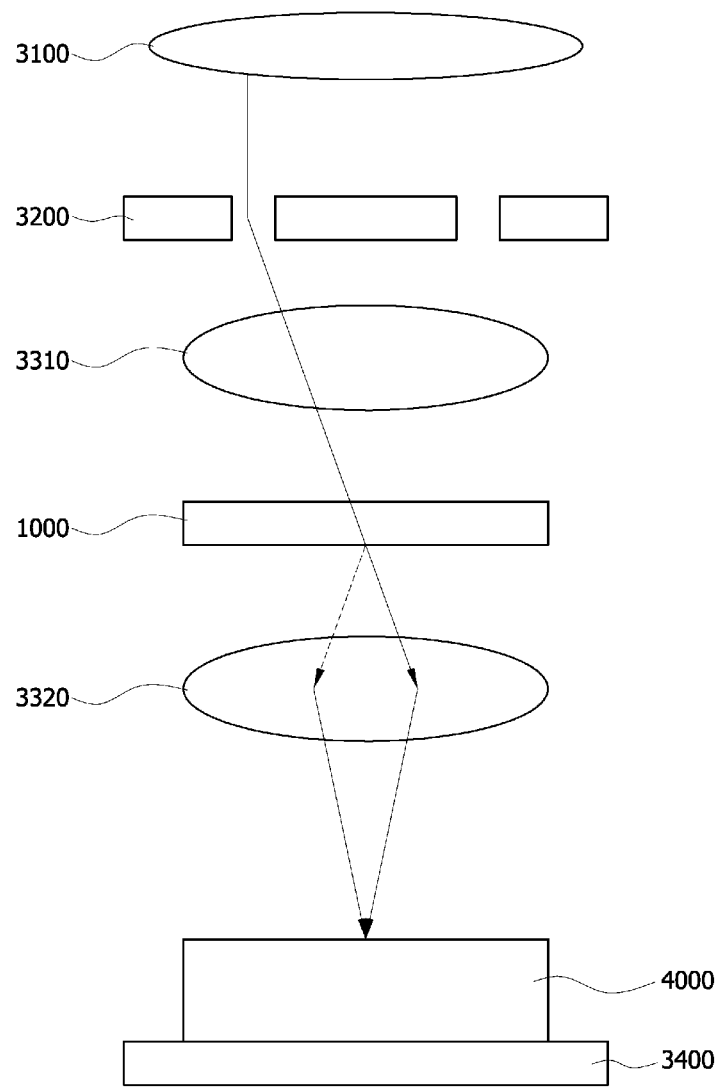
FIG. 15 is a schematic view illustrating an exposure system employing the photomask shown in FIG. 13.
Figure 16:
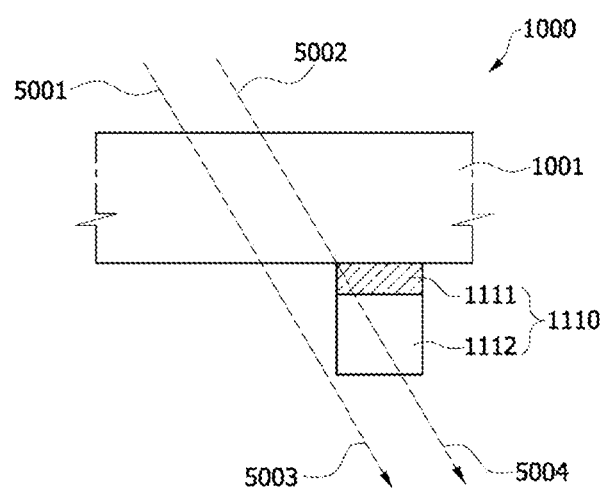
FIG. 16 is a cross-sectional view illustrating a portion of the photomask employed in the exposure system of FIG. 15.

FIG. 15 is a schematic view illustrating an exposure system 3000 employing a photomask 1000 according to an embodiment, and FIG. 16 is a cross-sectional view illustrating a portion of the photomask 1000 employed in the exposure system 3000 of FIG. 15. In FIG. 16, the same reference numerals as used in FIG. 13 denote the same elements. As illustrated in FIG. 15, the exposure system 3000 may employ an off-axis illumination system and may include a light source 3100, an aperture plate 3200, a first lens module 3310, a second lens module 3320, and a stage 3400.

The photomask 1000 shown in FIG. 13 may be disposed between the first and second lens modules 3310 and 3320, and a wafer 4000 may be loaded onto the stage 3400. The wafer 3400 may include a photoresist layer coated on a top surface thereof. Light emitted from the light source 3100 may be irradiated onto the aperture plate 3200. Light penetrating the aperture plate 3200 may be concentrated by the first lens module 3310, and the light concentrated by the first lens module 3310 may be obliquely irradiated onto the photomask 1000. Light penetrating the photomask 1000 may be diffracted to produce a 0-th order diffraction light (as indicated by a dotted line) and a first order diffraction light (as indicated by a solid line), and the 0-th order diffraction light and the first order diffraction light may be concentrated by the second lens module 3320 and then irradiated onto the wafer 4000.

As illustrated in FIG. 16, incident light irradiated onto the light transmission substrate 1001 of the photomask 1000 through the first lens module 3310 of FIG. 15 may include first incident light 5001 and second incident light 5002. The first incident light 5001 may be transmitted through the light transmission substrate 1001 to produce first transmission light 5003, and the second incident light 5002 may be transmitted through the light transmission substrate 1001 and the transfer pattern 1110 to produce second transmission light 5004. The first transmission light 5003 may have a phase difference of 180 degrees with respect to the second transmission light 5004. While an intensity of the first transmission light 5003 is substantially equal to an intensity of the first incident light 5001, an intensity of the second transmission light 5004 may be less than an intensity of the second incident light 5002. That is, the intensity of the second transmission light 5004 may be less than the intensity of the first transmission light 5003. The intensity of the second transmission light 5004 may be dominantly determined by an optical transmittance of the first transmittance control pattern 1111.

If an optical transmittance of the light transmission substrate 1001 is substantially equal to 100%, the intensity of the first transmission light 5003 may be substantially equal to the intensity of the first incident light 5001. However, the first transmission light 5003 travelling along an optical path adjacent to the transfer pattern 1110 may interfere with the second transmission light 5004 penetrating the transfer pattern 1110.

For example, regarding the conventional phase shift photomask 10 on the left side of FIG. 14 having the thick phase shift pattern 12, about 10% to about 20% of an amount of the first transmission light 5003 may interfere with the second transmission light 5004. In order to sufficiently offset the first transmission light 5003 with the second transmission light 5004, the intensity of the second transmission light 5004 has to be at least 6% of the intensity of the second incident light 5002. If a distance between adjacent phase shift patterns 12 of the conventional phase shift photomask 10 on the left side of FIG. 14 is reduced, the amount of the first transmission light 5003 may be reduced. Thus, an amount of the first incident light 5001 may be increased to compensate for the reduced amount of the first transmission light 5003. Because the first incident light 5001 and the second incident light 5002 may be emitted from the same light source, the first incident light 5001 and the second incident light 5002 may have the same intensity. Accordingly, if the amount or intensity of the first incident light 5001 is increased, that of the second incident light 5002 is also increased, leading to an increase in an amount of a portion of the second incident light 5002 absorbed into the phase shift pattern 12. As a result, a thermal stress applied to the conventional phase shift photomask 10 may also increase.

Meanwhile, regarding the photomask 1000 shown in FIG. 16, the first transmittance control pattern 1111 dominantly affecting an optical transmittance of the transfer pattern 1110 may be relatively thin compared with the phase shift pattern 12 of the conventional phase shift photomask 10 on the left side of FIG. 14. Thus, the first transmission light 5003 may be less interfered with second transmission light 5004. That is, the intensity of the first transmission light 5003 may be almost equal to the intensity of the first incident light 5001. Thus, even when a distance between adjacent transfer patterns 1110 of the photomask 1000 is reduced, it may be unnecessary to increase an intensity of the light emitted from the light source.

Accordingly, a thermal stress of a photomask as well as a thermal stress of a lens module in an exposure system may be reduced.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A photomask comprising:
a light transmission substrate;
a plurality of pattern regions disposed over the light transmission substrate, a shape of the plurality of pattern regions being transferred onto a wafer during an exposure process; and
a light blocking region surrounding the plurality of pattern regions,
wherein each of the plurality of pattern regions is a light transmitting region that exposes a portion of the light transmission substrate,
wherein the light blocking region includes first light blocking patterns that respectively surround the plurality of pattern regions to have closed loop shapes and second light blocking patterns that are disposed between adjacent first light blocking patterns, adjacent second light blocking patterns being spaced apart from each other by a first distance in a first direction, and
wherein the first light blocking patterns have a first thickness and the second light blocking patterns have a second thickness which is smaller than the first thickness.

2. The photomask of claim 1, wherein each of the first light blocking patterns has a rectangular closed loop shape and provides an opening that corresponds to the light transmitting region, the first light blocking patterns having a uniform width, the width of the first light blocking patterns corresponding to a length in a direction perpendicular to a longitudinal direction of the first light blocking patterns, and
wherein the opening has a tetragonal shape surrounded by a corresponding one of the first light blocking patterns.

3. The photomask of claim 2, wherein each of the second light blocking patterns extends in a second direction intersecting with the first direction.

4. The photomask of claim 3, wherein each of the second light blocking patterns has substantially the same width as a width the first light blocking patterns, the width of each of the second light blocking patterns corresponding to a length in a direction perpendicular to the second direction.

5. The photomask of claim 3, wherein both ends of each of the second light blocking patterns disposed between the adjacent first light blocking patterns contact the adjacent first light blocking patterns, respectively, the adjacent first light blocking patterns being arrayed in the second direction.

6. The photomask of claim 5, wherein the light transmission substrate includes trenches, each of the trenches corresponding to a recessed portion under a gap region disposed between adjacent second light blocking patterns, the trenches having a predetermined depth.

7. The photomask of claim 6, wherein the predetermined depth of the trenches are determined such that first light transmitted through a corresponding one of the second light blocking patterns and the light transmission substrate has a phase difference of 180 degrees with respect to second light transmitted through a corresponding one of the trenches and the light transmission substrate.

8. The photomask of claim 1, wherein the second thickness of the second light blocking patterns is within a range of about 5% to about 80% of the first thickness of the first light blocking patterns.

9. The photomask of claim 1, wherein the second thickness of the second light blocking patterns is within a range of about 5% to about 50% of the first thickness of the first light blocking patterns.

10. The photomask of claim 1, wherein the second light blocking patterns disposed between adjacent first light blocking patterns arrayed in the first direction and an outermost second light blocking pattern is spaced apart from a corresponding one of the adjacent first light blocking patterns by a second distance.

11. The photomask of claim 10, wherein the second distance is substantially equal to the first distance.

12. The photomask of claim 10, wherein the light transmission substrate include trenches, each of the trenches corresponding to a recessed portion under a gap region disposed between adjacent second light blocking patterns or between the first and second light blocking patterns that are spaced apart by the second distance, the trenches having a predetermined depth.

13. The photomask of claim 12, wherein the predetermined depth of the trenches is determined such that first light transmitted through a corresponding one of the second light blocking patterns and the light transmission substrate has a phase difference of 180 degrees with respect to second light transmitted through a corresponding one of the trenches and the light transmission substrate.

14. The photomask of claim 1, wherein the first and second light blocking patterns include the same light blocking material.

15. The photomask of claim 1, wherein the first and second light blocking patterns include the same phase shift material.

* * * * *